(12) United States Patent
Tsao et al.

(10) Patent No.: US 9,263,287 B2
(45) Date of Patent: Feb. 16, 2016

(54) METHOD OF FORMING FIN-SHAPED STRUCTURE

(71) Applicant: UNITED MICROELECTRONICS CORP., Hsin-Chu (TW)

(72) Inventors: Po-Chao Tsao, New Taipei (TW); Chien-Ting Lin, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 256 days.

(21) Appl. No.: 13/902,970

(22) Filed: May 27, 2013

(65) Prior Publication Data

US 2014/0349482 A1    Nov. 27, 2014

(51) Int. Cl.
*H01L 21/302* (2006.01)
*H01L 21/308* (2006.01)
*H01L 29/66* (2006.01)

(52) U.S. Cl.
CPC ...... *H01L 21/3086* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 8,003,466 B2 * | 8/2011 | Shi et al. | 438/283 |
| 8,603,893 B1 * | 12/2013 | Wei et al. | 438/424 |
| 8,617,996 B1 * | 12/2013 | Chi et al. | 438/700 |
| 8,658,536 B1 * | 2/2014 | Choi et al. | 438/699 |
| 8,697,515 B2 * | 4/2014 | Yin et al. | 438/239 |
| 8,753,940 B1 * | 6/2014 | Wei et al. | 438/283 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0101995 A1 | 4/2009 | Beintner | |
| 2009/0124097 A1 | 5/2009 | Cheng | |
| 2009/0242964 A1 | 10/2009 | Akil | |

(Continued)

OTHER PUBLICATIONS

Kawasaki, H. et al "FinFET Process and Integration Technology for High Performance LSI in 22 nm node and beyond" Junction Technology, 2007 International Workshop on, IEEE, 2007, pp. 3-8.*

(Continued)

*Primary Examiner* — Anita Alanko
(74) *Attorney, Agent, or Firm* — Winston Hsu; Scott Margo

(57) ABSTRACT

A method of forming fin-shaped structures includes the following steps. A plurality of spacers is formed on a substrate. The substrate is etched by using the spacers as hard masks to form a plurality of fin-shaped structures in the substrate. A cutting process is then performed to remove parts of the fin-shaped structures and the spacers formed on the removed parts.

14 Claims, 5 Drawing Sheets

(56) References Cited

U.S. PATENT DOCUMENTS

| | | |
|---|---|---|
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2012/0306027 A1* | 12/2012 | Kronholz et al. .............. 257/410 |
| 2013/0065326 A1* | 3/2013 | Sudo ................................ 438/3 |
| 2013/0143372 A1* | 6/2013 | Kim et al. ..................... 438/163 |
| 2013/0217233 A1* | 8/2013 | Chang et al. .................. 438/702 |
| 2014/0091434 A1* | 4/2014 | Hopkins ........................ 257/618 |
| 2014/0151807 A1* | 6/2014 | Chi et al. ....................... 257/348 |
| 2014/0175554 A1* | 6/2014 | Loubet et al. ................. 257/368 |

OTHER PUBLICATIONS

Chien Ting Lin, "FinFET various device width offering for SIT process", Invention Disclosure , Feb. 14, 2011, p. 1-7.

Chien et al., Title: Semiconductor Process , pending U.S. Appl. No. 13/243,485, filed Sep. 23, 2011.

\* cited by examiner

METHOD OF FORMING FIN-SHAPED STRUCTURE

BACKGROUND OF THE INVENTION

1. Field of the Invention

The present invention relates generally to a method of forming a fin-shaped structure, and more specifically to a method of forming a fin-shaped structure by transferring the pattern of spacers.

2. Description of the Prior Art

With increasing miniaturization of semiconductor devices, various Multi-gate MOSFET devices have been developed. The Multi-gate MOSFET is advantageous for the following reasons. Manufacturing processes of Multi-gate MOSFET devices can be integrated into traditional logic device processes, and thus are more compatible. In addition, since the three-dimensional structure of the Multi-gate MOSFET increases the overlapping area between the gate and the substrate, the channel region is controlled more effectively. This reduces both the drain-induced barrier lowering (DIBL) effect and the short channel effect. Moreover, as the channel region is longer for the same gate length, the current between the source and the drain is increased.

A multi-gate MOSFET has a gate formed on fin-shaped structures, and the fin-shaped structures are formed on a substrate, wherein the fin-shaped structures formed by etching the substrate are strip structures parallel to each other. With the demands of miniaturization of semiconductor devices, the width of each fin-shaped structure narrows and the spacing between the fin-shaped structures shrinks. Thus, forming fin-shaped structures which can achieve the required demands under the restrictions of miniaturization, physical limitations and various processing parameters becomes an extreme challenge.

SUMMARY OF THE INVENTION

The present invention therefore provides a method of forming fin-shaped structures, which transfers the layout of spacers to a substrate to form fin-shaped structures, and then performs a cutting process to remove unnecessary parts of the fin-shaped structures. An accurate layout of fin-shaped structures can be achieved by this method, and uniform fin-shaped structures having the same widths in relative dense and isolate areas can be formed.

The present invention provides a method of forming fin-shaped structures including the following steps. A plurality of spacers is formed on a substrate. The substrate is etched by using the spacers to serve as hard masks to form a plurality of fin-shaped structures in the substrate. A cutting process is performed to remove parts of the fin-shaped structures and the spacers formed on the removing parts.

According to the above, the present invention provides a method of forming fin-shaped structures, which transfers the layout of spacers to a substrate to form fin-shaped structures, and then performs a cutting process to remove unnecessary parts of fin-shaped structures and the spacers formed thereon, in order to forma desired layout of fin-shaped structures. Therefore, uniform fin-shaped structures having the same widths but different respective spacings can be formed, meaning the fin-shaped structures formed in dense areas, isolate areas or edge areas can all have the same widths.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 schematically depict cross-sectional views of a method of forming fin-shaped structures and a layout of spacers according to an embodiment of the present invention.

DETAILED DESCRIPTION

FIGS. 1-9 schematically depict cross-sectional views of a method of forming fin-shaped structures and a layout of spacers according to an embodiment of the present invention. Please refer to FIGS. 1-9, wherein the top diagrams of these respective figures depict top views of layouts of spacers, and the bottom diagrams of these respective figures depict cross-sectional views along direction X of top views of layouts of spacers.

Figure 1:
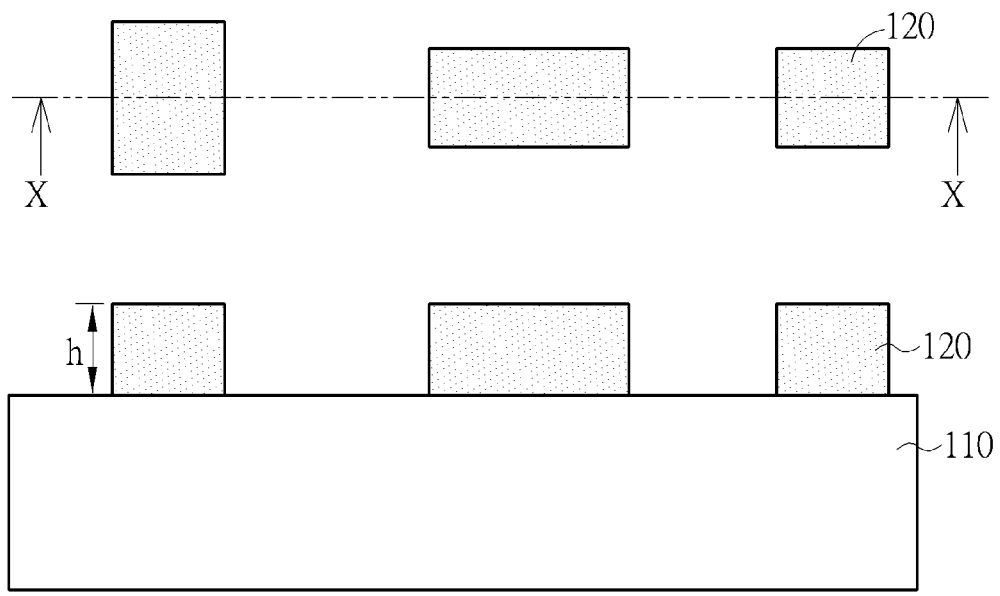
FIG. 1 shows a plurality of sacrificial patterns formed on a substrate.
Figure 2:
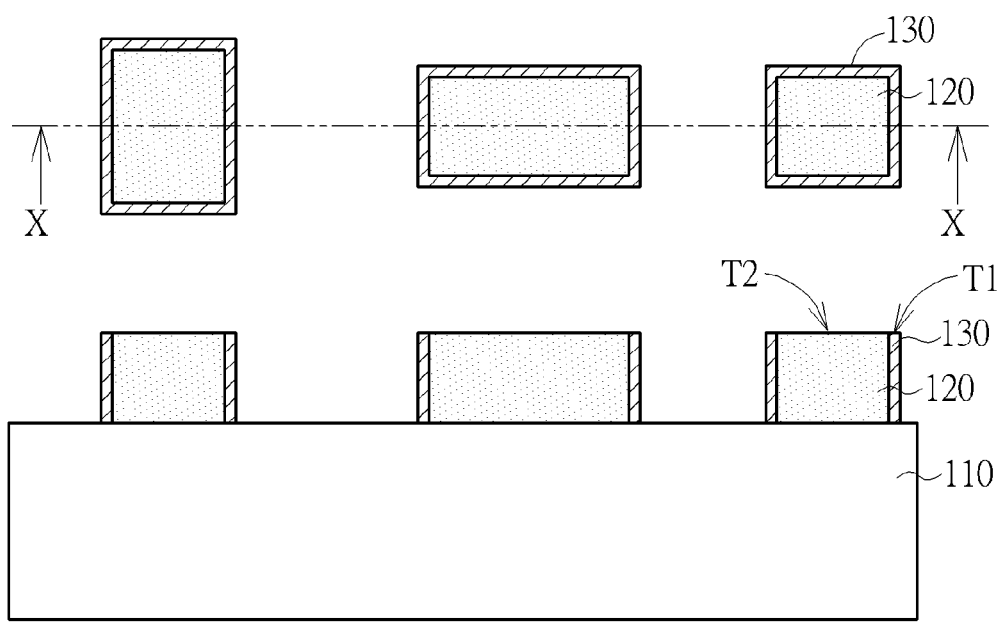
FIG. 2 shows a plurality of spacers formed on the substrate next to the sacrificial patterns.
Figure 3:
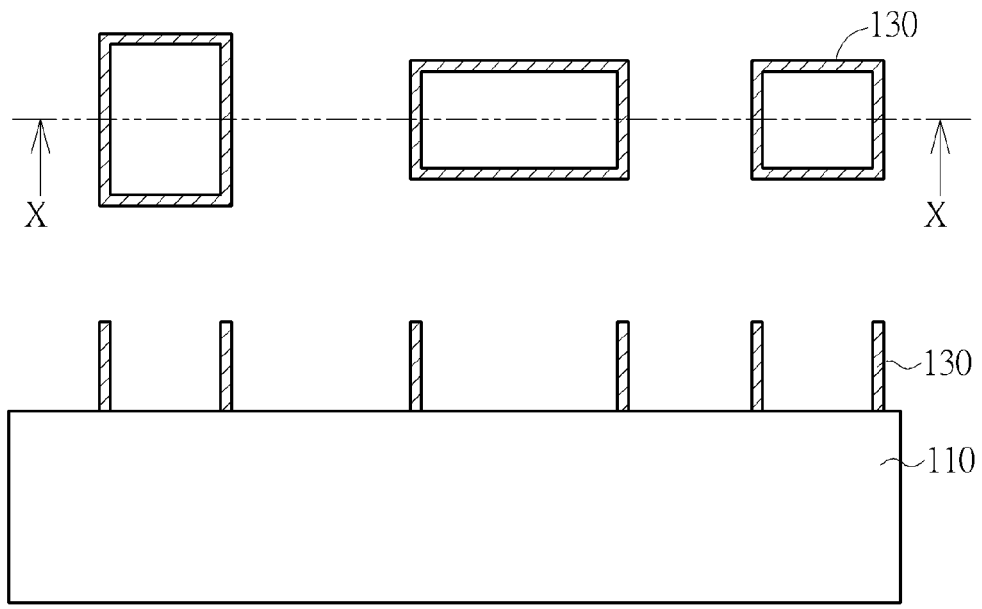
FIG. 3 shows a plurality of spacers formed on the substrate after sacrificial patterns are removed.

As shown in FIGS. 1-3, a plurality of spacers 130 is formed on a substrate 110. More precisely, as shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A plurality of sacrificial patterns 120 are formed on the substrate 110. In this embodiment, the method of forming the sacrificial patterns 120 is integrated into a gate process. For example, a gate process can be performed to form a plurality of sacrificial gates which serve as the sacrificial patterns 120 on the substrate 110, but it is not limited thereto. In one case, the sacrificial patterns 120 are polysilicon gates, but the material is not restricted therein. In this embodiment, as shown in the top diagram of FIG. 1, each sacrificial pattern 120 can have a different volume and shape; as shown in the bottom diagram of FIG. 1, each sacrificial pattern 120 can have the same height h. Thus, a desired layout of fin-shaped structures which will have the same widths after undergoing later processing can be obtained.

As shown in FIG. 2, a plurality of spacers 130 is formed on the substrate 110 next to the sacrificial patterns 120. More precisely, a spacer material (not shown) conformally covers the sacrificial patterns 120 and the substrate 110, and the spacer material is then etched to form the spacers 130. This step can be integrated into a gate process. The spacers 130 may be nitride spacers, but are not limited thereto. The spacer 130 may be composed of materials having etching selectivity to the material of the sacrificial patterns 120, and the spacers 130 may be composed of multi dielectric layers. As shown in the top diagram of FIG. 2, the sacrificial patterns 120 are rectangular, and the spacers 130 surround each of the sacrificial patterns 120, thereby the spacers 130 are closed rectangular frames. As shown in the bottom diagram of FIG. 2, the spacers 130 are formed on the substrate 110 next to the sacrificial patterns 120, and the top surfaces T1 of the spacers 130 are flush with the top surfaces T2 of the sacrificial patterns 120.

The sacrificial patterns 120 are then removed, so the closed rectangular frames of the spacers 130 remain on the substrate 110 and the parts of the substrate 110 directly below the sacrificial patterns 120 are exposed.

Figure 4:
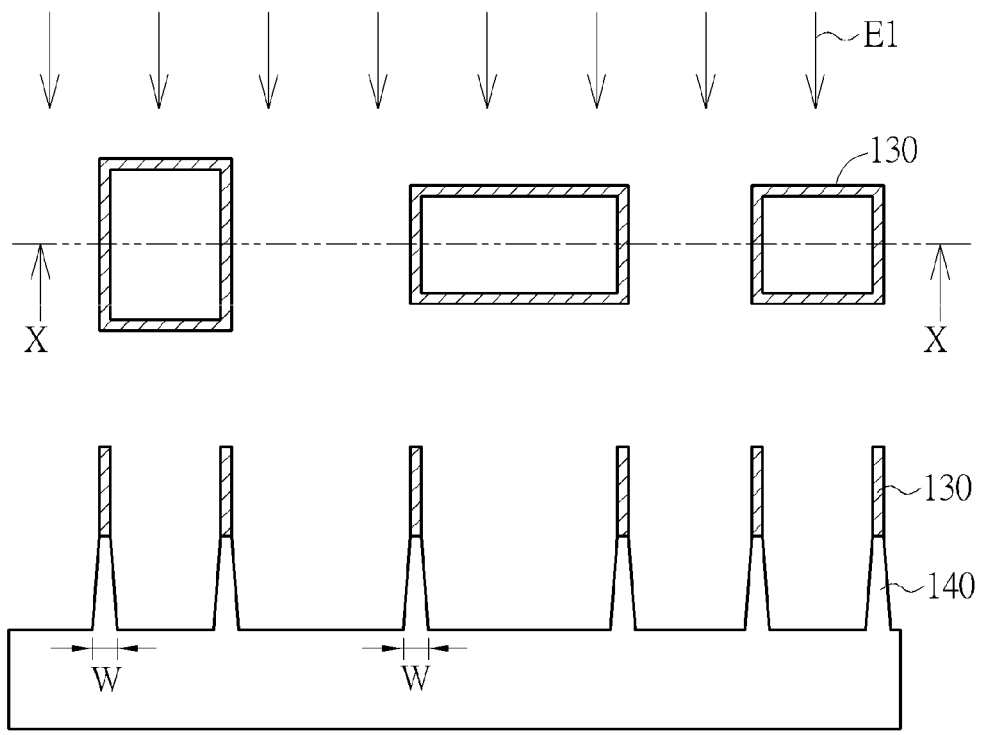
FIG. 4 shows the pattern of the spacers transferred to the substrate.

As shown in FIG. 4, the pattern of the spacers 130 is transferred to the substrate 110 to form the fin-shaped structures 140. For instance, an etching process E1 is performed to etch the substrate 110 by using the spacers 130 to serve as hard masks; thereby, the plurality of fin-shaped structures 140 are formed in the substrate 110. The etching process E1 may be a dry etching process, a wet etching process, or a sequentially performed dry and wet etching process, etc. The method of forming the fin-shaped structures 140 of the present invention can form the fin-shaped structures 140 all having substantially the same width w approaching 10 nanometers or less, and having spacings approaching 35 nanometers or less; an accurate layout of fin-shaped structures 140 can therefore be achieved.

Figure 5:
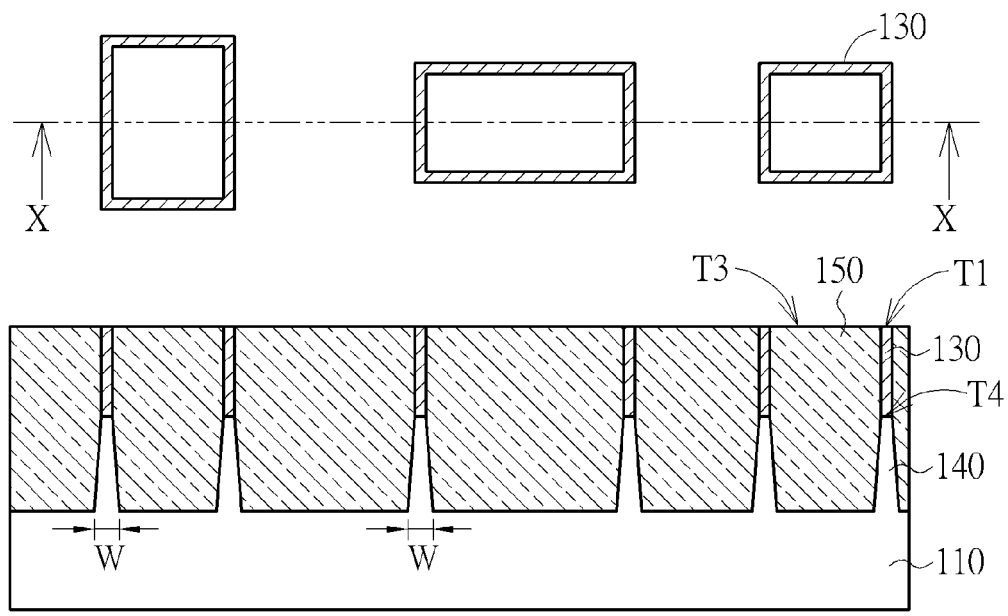
FIG. 5 shows filling with isolation material.
Figure 6:
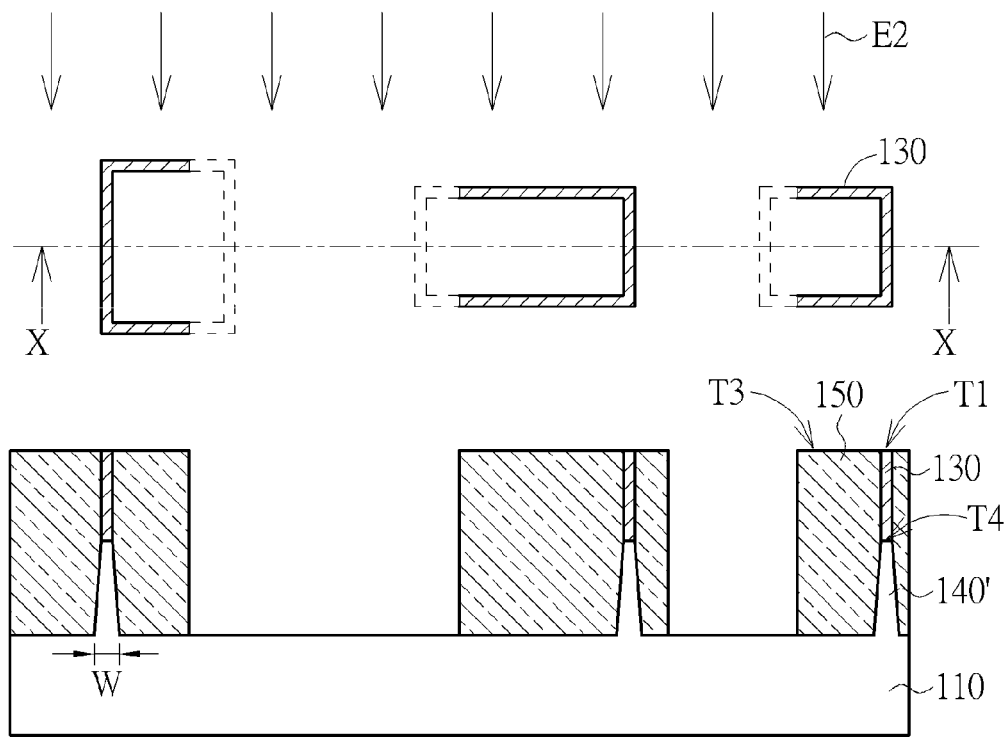
FIG. 6 shows a cutting process.

As shown in FIG. 5, a first isolation material 150 may be selectively filled between the fin-shaped structures 140. Then, as shown in FIG. 6, a cutting process E2 is performed to remove parts of the fin-shaped structures 140, parts of the spacers 130 thereon, and parts of the corresponding first isolation material 150, thereby the fin-shaped structures 140' are formed.

In this embodiment, the first isolation material 150 fills the space between each of the fin-shaped structures 140 and the spacers 130, and then an appropriate planarization process may be selectively performed, enabling a top surface T3 of the first isolation material 150 to be substantially flush with the top surfaces T1 of the spacers 130. In another embodiment, the first isolation material 150 may partially fill the space between each of the fin-shaped structures 140 and the spacers 130. For instance, an etching back process may be performed on the first isolation material 150, enabling the top surface T3 of the first isolation material 150 to be approximately flush with top surfaces T4 of the fin-shaped structures 140. The exposed parts of the substrate 110 between the fin-shaped structures 140 will not be damaged while the cutting process E2 is performed, as the first isolation material 150 fills the exposed parts of the substrate 110 between the fin-shaped structures 140. The amount which the first isolation material 150 fills between the fin-shaped structures 140 is related to the etching selectivity of the cutting process E2 to the isolation material 150 and to the spacers 130 and the fin-shaped structures 140. The etching selectivity means the difference of the etching rates of the cutting process E2 between the isolation material 150 and the spacers 130/the fin-shaped structures 140. In this embodiment, the first isolation material 150 may be oxide, but it is not limited thereto.

It is emphasized that the etching loading effect will occur while the fin-shaped structures 140 are formed in a so-called fin-cut first process by transferring the layout of the spacers 130 having too large spacing differences. As a result, the widths w of the fin-shaped structures 140 are not the same. When the maximum spacing of the fin-shaped structures 140 is larger than 1.5 times the minimum spacing of the fin-shaped structures 140 or more, the etching loading effect becomes serious. On the contrary, in the present invention of fin-cut last process, the spacers 130 having a substantially uniform layout as shown in FIG. 2 are formed, and then the fin-shaped structures 140 are formed by transferring the layout of the spacers 130 (as shown in FIG. 4); thereafter, the first isolation material 150 may be selectively formed between each of the fin-shaped structures 140, and then the cutting process E2 is performed to remove unnecessary parts of the fin-shaped structures 140 and form the fin-shaped structures 140'. The cutting process E2 is performed to remove the parts of the fin-shaped structures 140 which are perpendicular to a direction X. By doing this, the fin-shaped structures 140' in each areas such as in at least an isolated area, a dense area or an edge area can have the same widths W even though the spacing between each fin-shaped structures 140' is significantly different from each other. In other words, the etching load effect caused by the significantly different spacing between each of the fin-shaped structures 140' leading the widths of the fin-shaped structures 140' to be different can be prevented. For example, in a fin-cut first process, the widths W of the fin-shaped structures 140' in an isolated area will be larger than those in a dense area or the widths W of the fin-shaped structures 140' in an edge area will be larger than those in a dense area due to the loading effect.

Figure 7:
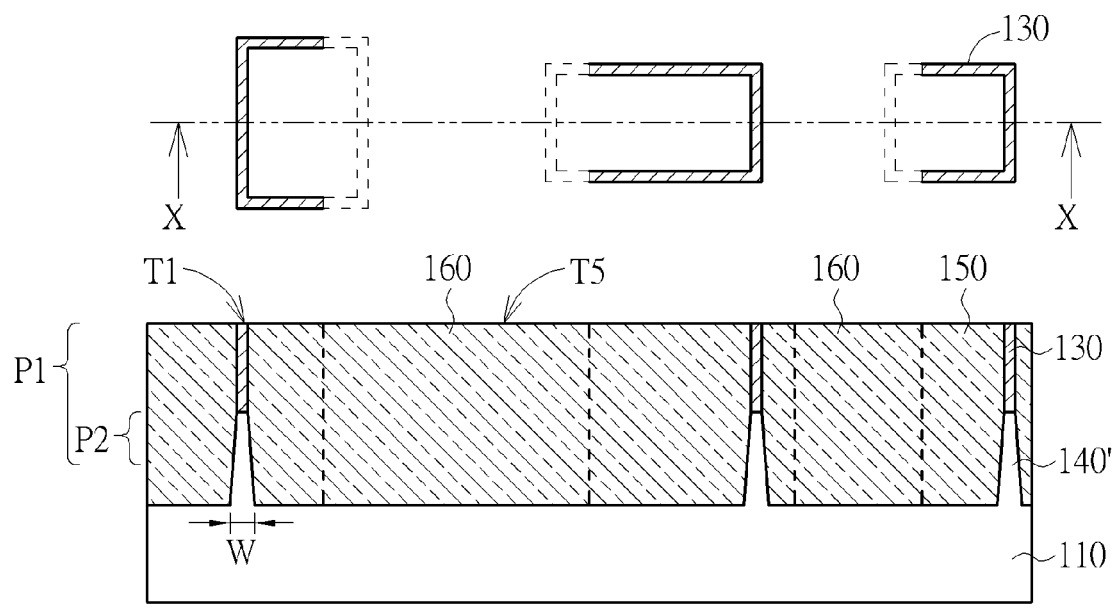
FIG. 7 shows filling with isolation material.

A second isolation material 160 is filled and then an appropriate planarization process may be performed, enabling a top surface T5 of the second isolation material 160 to be flush with the top surfaces T1 of the spacers 130. The space generated by the removing of the first isolation material 150 and the fin-shaped structures 140 can be filled, as shown in FIG. 7. Dashed lines in FIG. 7 indicate the interfaces of the first isolation material 150 and the second isolation material 160. In a preferred embodiment, the first isolation material 150 and the second isolation material 160 are the same materials. For instance, the first isolation material 150 and the second isolation material 160 are all oxides. Therefore, in a macroscopic aspect, the first isolation material 150 and the second isolation material 160 can form a bulk isolation structure between the fin-shaped structures 140'.

Figure 8:
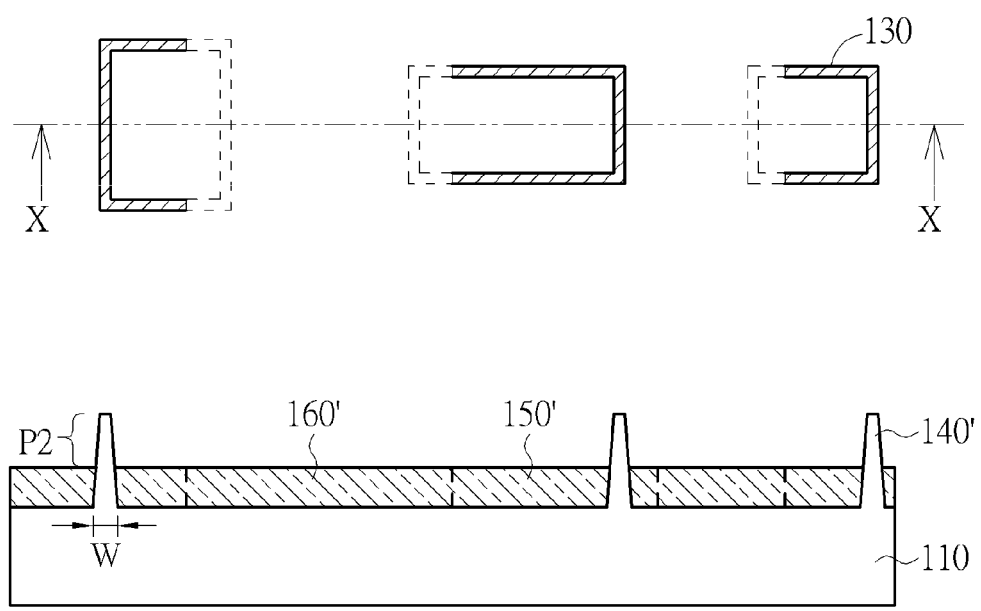
FIG. 8 shows exposing fin-shaped structures.

The spacers 130, a top part P1 of the first isolation material 150 and a top part P1 of the second isolation material 160 can be removed to expose a top part P2 of the fin-shaped structures 140', as shown in FIG. 8. The first isolation material 150' and the second isolation material 160' will remain between the fin-shaped structures 140', and components of a later formed transistor such as a gate structure can be disposed across the protruding top part P2.

Figure 9:
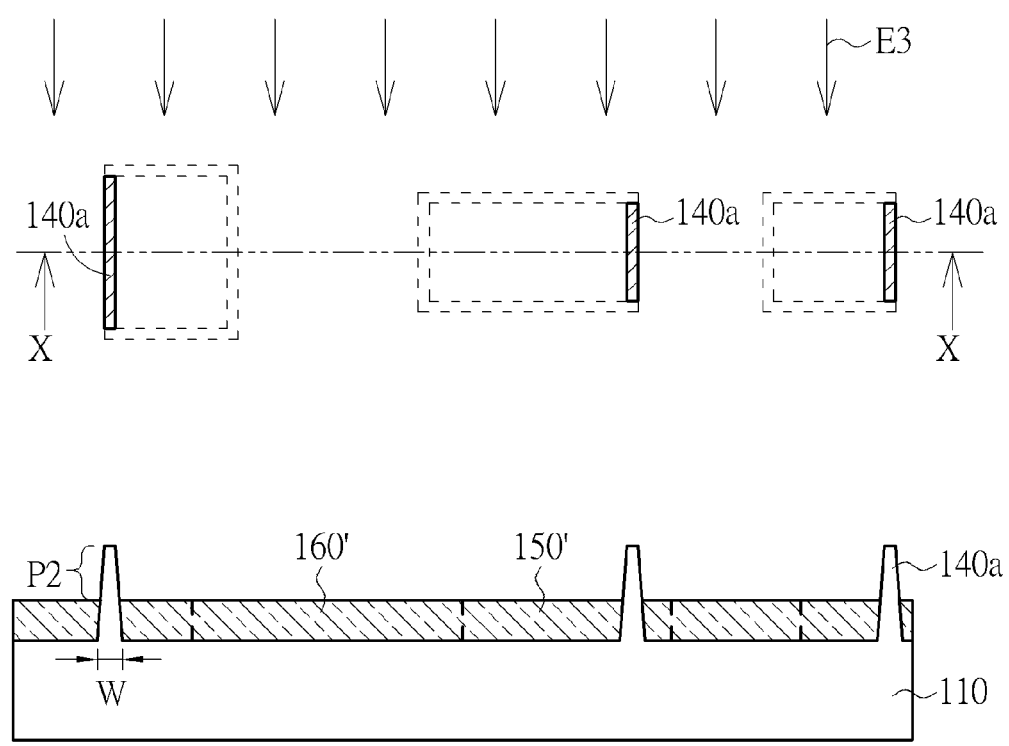
FIG. 9 shows a cutting process.

After the top part P2 of the fin-shaped structures 140' is exposed and before later transistor processes are performed, a fin-shaped structure cutting process E3 may be selectively performed to cut parts of the fin-shaped structures 140' to form fin-shaped structures 140a, as shown in FIG. 9. In this embodiment, the fin-shaped structures 140' are already electrically isolated from each other, and the fin-shaped structure cutting process E3 is performed to form a desired layout of the fin-shaped structures 140a. In another embodiment, the fin-shaped structures can be electrically isolated from each other by performing the fin-shaped structure cutting process E3. Moreover, the fin-shaped structure cutting process E3 is applied to remove the parts of the fin-shaped structures 140' which are parallel to the direction X, thereby the fin-shaped structures 140a will remain. Compared to the fin-shaped structure cutting process E3, the aforesaid cutting process E2 is applied to remove the parts of the fin-shaped structures 140 which are perpendicular to the direction X. In this way, parts of the fin-shaped structures 140 can be respectively removed by the cutting process E2 and the fin-shaped structure cutting process E3 through different directions (such as two directions perpendicular to each other) to form the fin-shaped structures 140a having a desired layout.

To summarize, the present invention provides a method of forming fin-shaped structures, which transfers the layout of spacers to a substrate to form fin-shaped structures, performs a cutting process to remove unnecessary parts of fin-shaped structures and the spacers formed thereon to form a desired layout of fin-shaped structures, and then removes the remaining spacers. Uniform fin-shaped structures having the same widths but different spacing can be formed, meaning the fin-shaped structures formed in dense areas, isolate areas or edge areas can all have the same widths. Thereby, the fin-shaped structures having accurate layout can be formed.

Furthermore, a first isolation material can be filled between the fin-shaped structures before the cutting process is performed, so that parts of the substrate between the fin-shaped structures will not be damaged by the cutting process. After the cutting process is performed, a second isolation material may fill the space generated by the removal of the fin-shaped structures and first isolation material through the cutting process, so an isolation structure between the fin-shaped structures can be formed. Then, a fin-shaped structure cutting process may be performed to cut parts of the fin-shaped structures, enabling a gate structure to be formed across the fin-shaped structures in later processes, wherein the cutting process E2 and the fin-shaped structure cutting process E3 remove pars of the fin-shaped structures respectively through different directions such as two directions perpendicular to each other. A desired layout of the fin-shaped structures can thereby be formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming fin-shaped structures, comprising:
    forming a plurality of spacers on a substrate;
    etching the substrate by using the spacers to serve as hard masks to form a plurality of fin-shaped structures in the substrate;
    performing a cutting process to remove parts of the fin-shaped structures and the spacers formed on the removed parts;
    filling a first isolation material between the fin-shaped structures before the cutting process is performed;
    using a second isolation material to fill the space generated by the removal of the first isolation material and the fin-shaped structures through the cutting process after the cutting process is performed; and
    removing the spacers, a top part of the first isolation material and a top part of the second isolation material after the second isolation material is filled to expose a top part of the fin-shaped structures.

2. The method of forming fin-shaped structures according to claim 1, wherein the step of forming the spacers on the substrate comprises:
    forming a plurality of sacrificial patterns on the substrate;
    forming the spacers on the substrate next to the sacrificial patterns; and
    removing the sacrificial patterns.

3. The method of forming fin-shaped structures according to claim 2, wherein the step of forming the spacers on the substrate next to the sacrificial patterns comprises:
    conformally covering the sacrificial patterns and the substrate with a spacer material; and
    etching the spacer material to form the spacers.

4. The method of forming fin-shaped structures according to claim 2, wherein the sacrificial patterns comprise polysilicon gates.

5. The method of forming fin-shaped structures according to claim 1, wherein the spacers comprise nitride spacers.

6. The method of forming fin-shaped structures according to claim 1, wherein the fin-shaped structures are distributed in at least an isolated area and at least a dense area.

7. The method of forming fin-shaped structures according to claim 1, wherein the first isolation material and the second isolation material are the same materials.

8. The method of forming fin-shaped structures according to claim 7, wherein the first isolation material and the second isolation material are oxides.

9. The method of forming fin-shaped structures according to claim 1, further comprising:
    removing the remaining spacers after the cutting process is performed.

10. The method of forming fin-shaped structures according to claim 1, further comprising:
    performing a fin-shaped structure cutting process to cut parts of the fin-shaped structures after the cutting process is performed to electrically isolate the fin-shaped structures from each other.

11. The method of forming fin-shaped structures according to claim 1, wherein the maximum spacing of the fin-shaped structures is smaller than 1.5 times the minimum spacing of the fin-shaped structures.

12. The method of forming fin-shaped structures according to claim 1, wherein the parts of the fin-shaped structures and the spacers formed on the removed parts are removed simultaneously while performing the cutting process.

13. The method of forming fin-shaped structures according to claim 1, wherein at least one of the fin-shaped structures and the spacers formed on the removed one are removed while performing the cutting process.

14. The method of forming fin-shaped structures according to claim 1, wherein the parts of the fin-shaped structures and the spacers formed on the removed parts are removed while performing the cutting process to obtain the remaining fin-shaped structures having different spacings.

* * * * *